United States Patent
Peng et al.

(10) Patent No.: US 9,961,796 B1
(45) Date of Patent: May 1, 2018

(54) SERVER

(71) Applicants: INVENTEC (PUDONG) TECHNOLOGY CORPORATION, Shanghai (CN); INVENTEC CORPORATION, Taipei (TW)

(72) Inventors: Ping-Wei Peng, Taipei (TW); Wen-Long Huang, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days. days.

(21) Appl. No.: 15/435,182

(22) Filed: Feb. 16, 2017

(30) Foreign Application Priority Data

Nov. 2, 2016 (CN) .......................... 2016 1 0950808

(51) Int. Cl.
*H05K 7/20* (2006.01)
*G06F 1/20* (2006.01)

(52) U.S. Cl.
CPC .......... *H05K 7/20145* (2013.01); *G06F 1/20* (2013.01); *H05K 7/20172* (2013.01); *H05K 7/20727* (2013.01)

(58) Field of Classification Search
CPC .......... H05K 7/20145; H05K 7/20172; H05K 7/20727; H05K 7/20136–7/2019; G06F 1/20
USPC ........ 361/679.49–679.51, 695–698; 454/184
See application file for complete search history.

(56) References Cited

U.S. PATENT DOCUMENTS

| | | | | |
|---|---|---|---|---|
| 7,551,437 B2* | 6/2009 | Itoh | ........................... | G06F 1/20 |
| | | | | 165/80.2 |
| 7,760,498 B2* | 7/2010 | Shan | .................. | H05K 7/20563 |
| | | | | 165/80.3 |
| 9,202,773 B2* | 12/2015 | Bae | ........................ | H01L 23/467 |
| 9,775,265 B2* | 9/2017 | Yoneda | .............. | H05K 7/20154 |
| 2002/0057168 A1* | 5/2002 | Yeh | ........................ | H01F 27/027 |
| | | | | 336/192 |
| 2005/0052828 A1* | 3/2005 | Chang | ..................... | G06F 1/181 |
| | | | | 361/679.02 |

(Continued)

FOREIGN PATENT DOCUMENTS

| | | |
|---|---|---|
| EP | 2 985 672 A2 | 2/2016 |
| TW | M272142 U | 8/2005 |
| TW | M499030 U | 4/2015 |

OTHER PUBLICATIONS

TW Office Action dated Jun. 21, 2017 as received in Application No. 105136933.

*Primary Examiner* — David M Sinclair
*Assistant Examiner* — Robert Brown
(74) *Attorney, Agent, or Firm* — Maschoff Brennan (57) ABSTRACT

A server includes a casing, a fan module, at least two processor holders and an air baffle. The casing has an accommodating space. The fan module is located in the accommodating space. The processor holders are located in the accommodating space. The air baffle includes a base and an airflow guiding member. The airflow guiding member is pivoted on the base. The airflow guiding member is shiftable among a plurality of air guiding positions. A processor module is mounted on one of the processor holders, and the base is mounted on the other processor holder. The airflow guiding member is at one of the air guiding positions in order to guide airflow from an air outlet side of the fan module.

9 Claims, 8 Drawing Sheets

(56) References Cited

U.S. PATENT DOCUMENTS

| | | | | |
|---|---|---|---|---|
| 2008/0265125 A1* | 10/2008 | Ye | ............................ | G06F 1/187 |
| | | | | 248/672 |
| 2011/0171899 A1* | 7/2011 | Ye | ............................ | G06F 1/20 |
| | | | | 454/284 |
| 2011/0184568 A1* | 7/2011 | Tai | ...................... | G05D 23/1934 |
| | | | | 700/282 |
| 2012/0058718 A1* | 3/2012 | Tang | ........................ | G06F 1/20 |
| | | | | 454/251 |
| 2012/0145363 A1* | 6/2012 | Peng | .................... | H01L 23/427 |
| | | | | 165/121 |
| 2012/0162913 A1* | 6/2012 | Lai | ..................... | H05K 7/20145 |
| | | | | 361/695 |
| 2012/0162917 A1* | 6/2012 | Chen | .................... | H01L 23/467 |
| | | | | 361/697 |
| 2012/0268890 A1* | 10/2012 | Stock | ........................ | G06F 1/20 |
| | | | | 361/679.53 |
| 2012/0325358 A1* | 12/2012 | Lin | ............................ | G06F 1/20 |
| | | | | 138/103 |
| 2014/0104770 A1* | 4/2014 | Tsai | ........................ | G06F 1/20 |
| | | | | 361/679.4 |
| 2015/0055296 A1* | 2/2015 | Joko | ................... | H05K 7/20145 |
| | | | | 361/695 |
| 2016/0037673 A1* | 2/2016 | Chen | .................... | H05K 7/1489 |
| | | | | 361/679.02 |
| 2016/0299542 A1* | 10/2016 | Cho | ........................ | G06F 1/20 |

\* cited by examiner

SERVER

CROSS-REFERENCE TO RELATED APPLICATIONS

This non-provisional application claims priority under 35 U.S.C. § 119(a) on Patent Application No(s). 201610950808.5 filed in China on Nov. 2, 2016, the entire contents of which are hereby incorporated by reference.

BACKGROUND OF THE DISCLOSURE

Technical Field of the Disclosure

The disclosure relates to a server, more particularly to a server having an air baffle.

Description of the Related Art

Cloud technology and the related applications are widely used in daily life, and the amount of personal information is increasing quickly with the development of various cloud-based serves and the related devices. Thus, servers play an important role in the cloud business. Generally, there is only one processor in one standard server, but the standard server has multiple processor holders for future expansion.

SUMMARY OF THE INVENTION

The present disclosure provides a server for efficiently controlling the airflow generated by the fan module.

One embodiment of the disclosure provides a server including a casing, a fan module, at least two processor holders and at least one air baffle. The casing has an accommodating space. The fan module is located in the accommodating space of the casing. The at least two processor holders are located in the accommodating space of the casing and located close to an air outlet side of the fan module. The at least one air baffle includes a base and at least one airflow guiding member connected to each other. The at least one airflow guiding member is detachably pivoted on the base. The at least one airflow guiding member is pivotable with respect to the base to be shiftable among a plurality of air guiding positions. A processor module is mounted on one of the at least two processor holders, and the base of the at least one air baffle is mounted on the other one of the at least two processor holders. The at least one airflow guiding member is at one of the plurality of air guiding positions in order to guide airflow from the air outlet side of the fan module.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present disclosure is not limited thereto. Furthermore, for the purpose of illustration, some of the structures and components in the figures are simplified, and wires, lines or bus are omitted in some of the figures.

Moreover, the terms used in the present disclosure, such as technical and scientific terms, have its own meanings and can be comprehended by person skill in the art, unless the term is additionally defined in the present disclosure. That is, the terms used in the following paragraphs should be read on the meaning commonly used in the related fields and will not be overly explained, unless the term has a specific meaning in the present disclosure.

Figure 1:
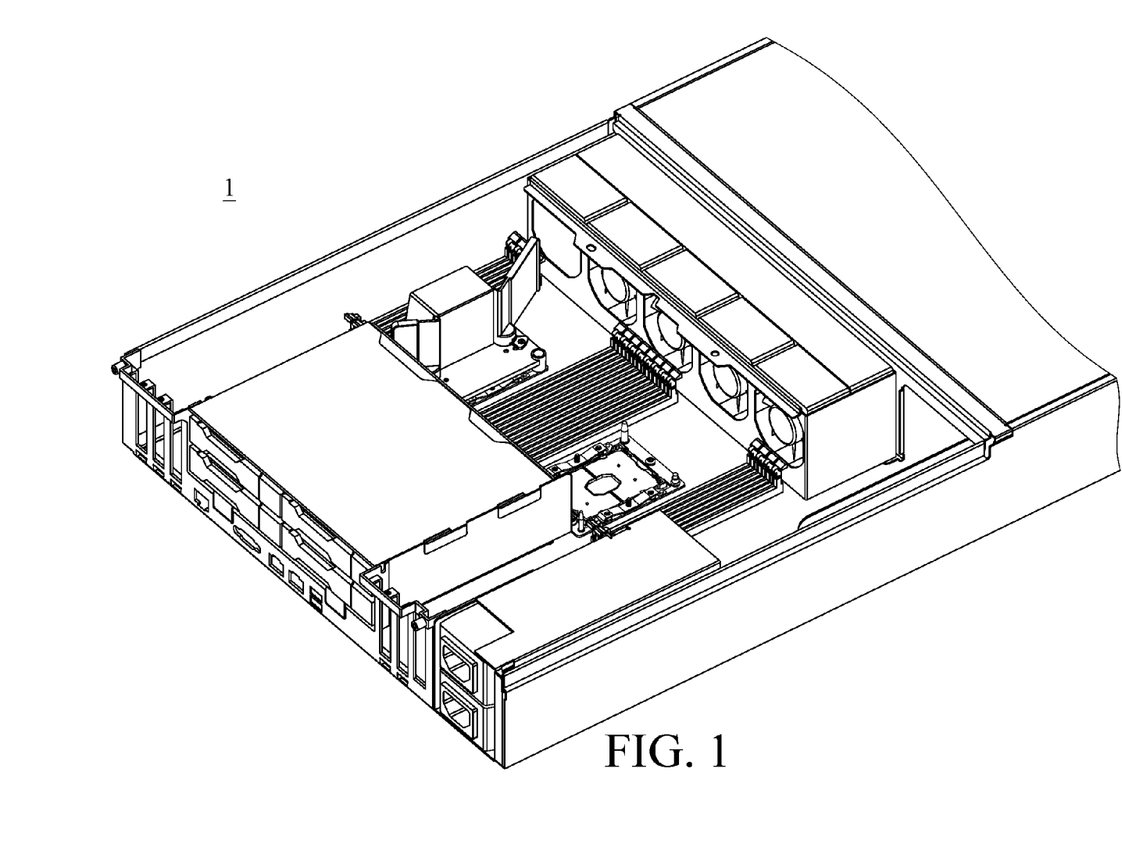
FIG. 1 is a perspective view of a server according to one embodiment of the disclosure.
Figure 2:
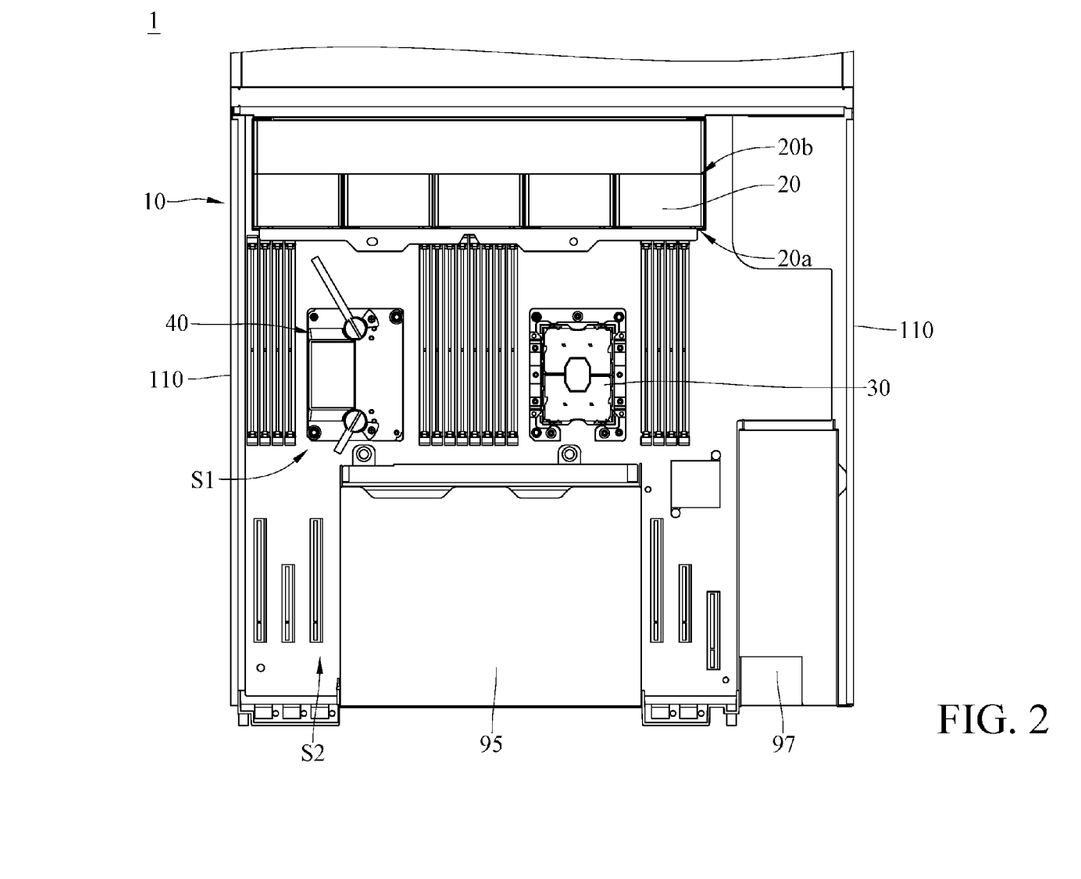
FIG. 2 is a top view of the server in FIG. 1.
Figure 3:
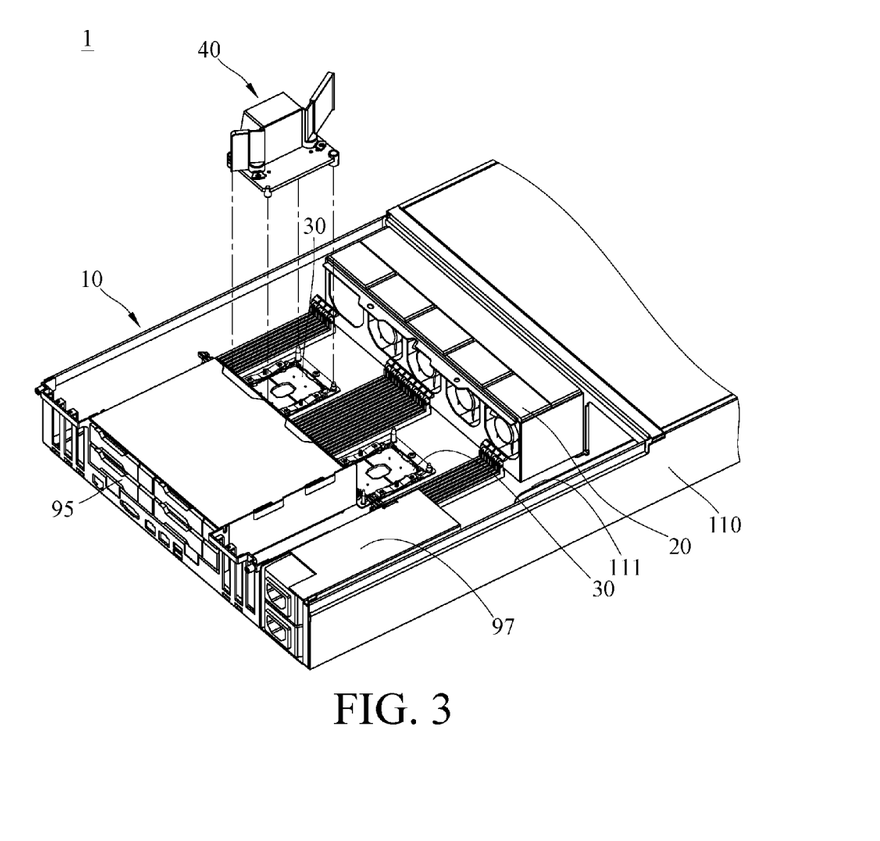
FIG. 3 is an exploded view of the server in FIG. 1.
Figure 4:
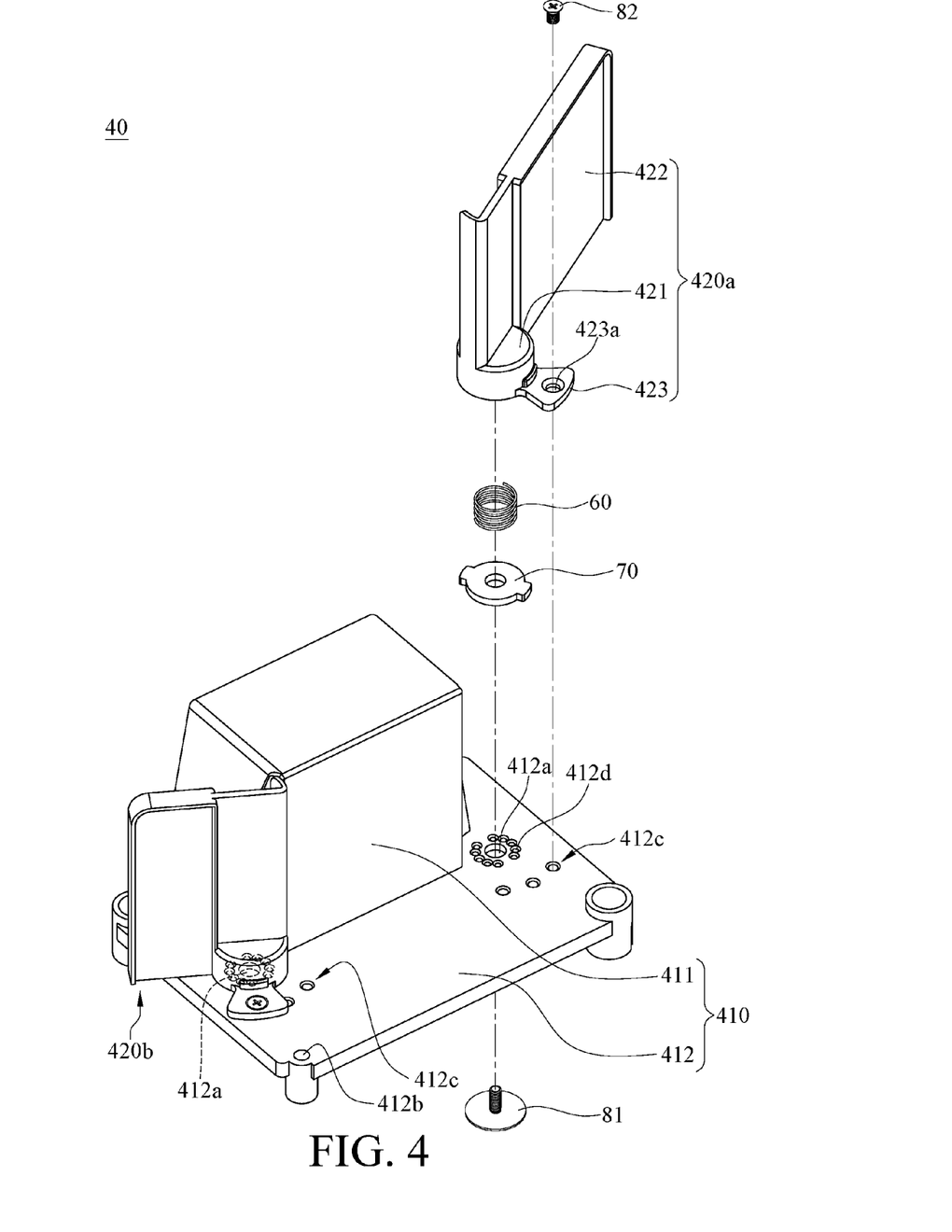
FIGS. 4 to 5 are exploded views of the air baffle of the server in FIG. 1 taken from different viewpoints.
Figure 5:
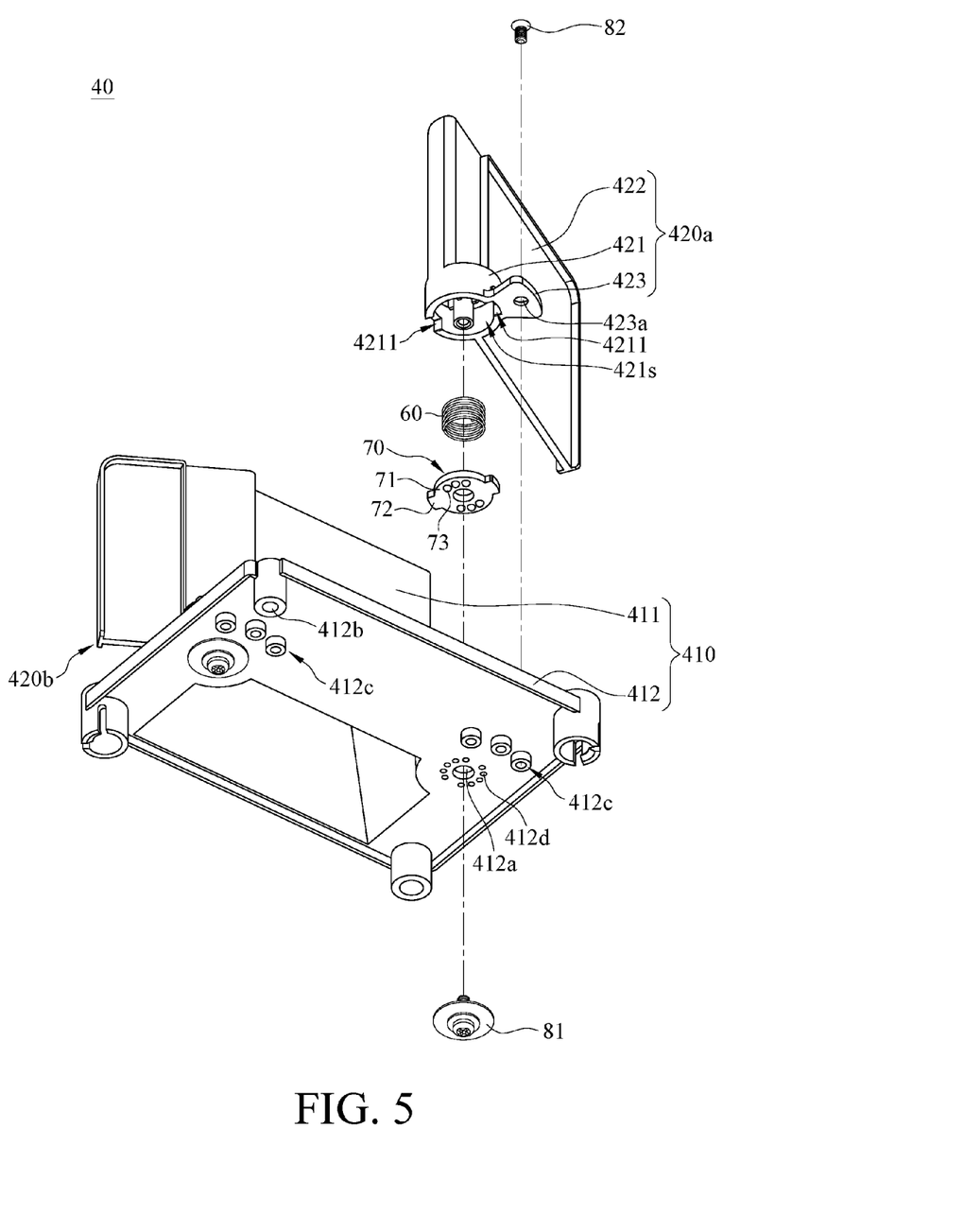
Figure 6:
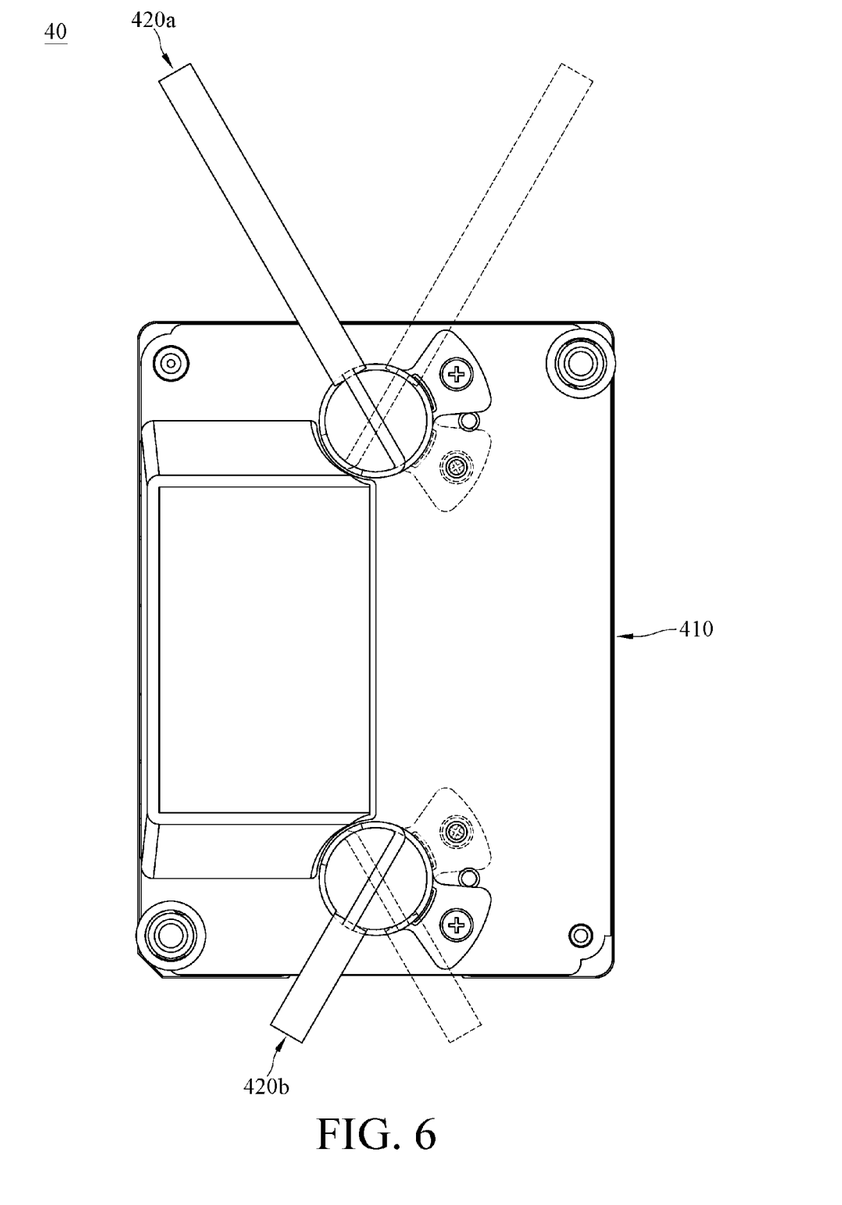
FIG. 6 is a schematic view showing the air baffle of the server in FIG. 1 being shifted to different air guiding positions.

Please refer to FIGS. 1 to 6. FIG. 1 is a perspective view of a server according to one embodiment of the disclosure, FIG. 2 is a top view of the server in FIG. 1, FIG. 3 is an exploded view of the server in FIG. 1, FIGS. 4 to 5 are exploded views of the air baffle of the server in FIG. 1 taken from different viewpoints, and FIG. 6 is a schematic view showing the air baffle of the server in FIG. 1 being shifted to different air guiding positions. As shown in FIG. 1, a server 1 is provided, and the server 1 is adaptive to a server cabinet (not shown).

In detail, as shown in FIGS. 2 to 3, in this embodiment, the server 1 includes a casing 10, a fan module 20, a plurality of processor holders 30, at least one air baffle 40, an electronic component 95 and an electronic component 97.

The casing 10 includes two side boards 110 and a bottom board 111. The two side boards 110 are respectively disposed on two sides of the bottom board 111 are opposite to each other. The two side boards 110 and the bottom board 111 together form an accommodating space S1 for accommodating the fan module 20, the processor holders 30, the air baffle 40, the electronic component 95, the electronic component 97, and other required components.

The fan module 20 is disposed on the bottom board 111 in order to remove heat generated by the electronic component 95 and the electronic component 97. In detail, the fan module 20 has an air outlet side 20a and an air inlet side 20b respectively located on two sides of the fan module 20 opposite to each other. The air outlet side 20a is located at a side of the fan module 20 facing the processor holders 30. In addition, in this embodiment, the fan module 20 includes a plurality of fans (not numbered), but the present disclosure is not limited to the number of the fans. In addition, from the point of view of FIG. 2, in this or some embodiments, the leftmost space of the fan module 20 has no fan because of actual factors, but the present disclosure is not limited thereto.

In this embodiment, the number of the processor holders 30 is two. The two processor holders 30 are disposed on the bottom board 111 and arranged close to the air outlet side 20a of the fan module 20. However, the present disclosure is not limited to the number, the location or the configuration of the processor holder 30. In some embodiments, the number of the processor holders 30 can be three or over three, and its locations and configurations can be changed according to the actual requirements.

In addition, each processor holder 30 has a plurality of mounting holes (not numbered) configured for the mounting of the processor module (not shown). The mounting hole of the processor holder 30 is, for example, a threaded hole or a fastening hole, but the present disclosure is not limited thereto. The said processor module includes, for example, a central processing unit (CPU) and a heat sink. In addition, in most casings, the number of the processor holders is greater than the number of the processor modules required for minimum operation, so that the user is able to install more processor modules for future expansion. For example, in this embodiment, the server 1 has two processor holders 30, but one processor module is enough to meet the minimum operational requirement. Thus, in a standard server, there is only one processor holder 30 equipped with the processor module, and the other processor holder 30 are not equipped with any processor module. However, it is understood that all the processor holders 30 may be equipped with the processor modules according to actual requirements, and the present disclosure is not limited thereto.

The electronic component 95 is, for example, a hard disk module. The electronic component 97 is, for example, a power module. In this and some embodiments, the electronic component 95 and the electronic component 97 are disposed at the rear end of the casing 10 and located close to the processor holders 30. That is, the electronic component 95 and the electronic component 97 are located at a side of the processor holders 30 opposite to the fan module 20. Also, the electronic component 95 and the electronic component 97 are able to be cooled down by the airflow generated by the fan module 20.

In addition, there are other electronic components being mounted with the electronic component 95 and the electronic component 97 according to the configuration of the printed circuit board. For example, as shown FIG. 2, there is an area for expansion S2 located at the left and the right side of the electronic component 95 and the peripheral of the two processor holders 30. The so called area for expansion S2 is the area for placing expansion slots (not numbered). Each of the said expansion slots is, for example, a RAM slot or a PCI slot. Before the insertion of the RAM or PCI card, the area for expansion S2 is an open space. The components in the area for expansion S2 is not the cooling target of the fan module 20. That is, the area for expansion S2 is not the predetermined area required to be cooled down. However, the present disclosure is not limited to the location and the number of the area for expansion S2.

Then, the details of the air baffle 40 are described in the following paragraphs. The air baffle 40 is disposed on the processor holder 30 which is not mounted with any processor module, for controlling the airflow generated by the fan module 20. In detail, the air baffle 40 includes a base 410 and two airflow guiding members 420a and 420b which are connected to the base 410. The airflow guiding member 420a and the airflow guiding member 420a are respectively located at two sides of the base 410 which are opposite to each other. Although the airflow guiding member 420a and the airflow guiding member 420b are different in appearance, but they are similar in configuration and structural relationship with the base 410. Thus, for the purpose of description, only the airflow guiding member 420a is illustrated in the following paragraphs.

The base 410 includes a protrusion part 411 and a mounting part 412 connected to each other. The protrusion part 411 is a box-shaped object, and the mounting part 412 is a plate-shaped object. The protrusion part 411 protrudes from a surface of the mounting part 412. The mounting part 412 is detachably mounted on one of the processor holders 30 not equipped with the processor module. In detail, the mounting part 412 has two through holes 412a and four mounting holes 412b. Each through hole 412a is used for the installation of the airflow guiding member 420a. The mounting holes 412b are respectively located at four corners of the mounting part 412, and respectively correspond to the mounting holes (not numbered) on the processor holder 30. When the base 410 is mounted on one of the processor holders 30, screws (not shown) are able to be respectively inserted into the mounting holes 412b of the mounting part 412 to be respectively fastened to the mounting holes on the processor holder 30, but the present disclosure is not limited to the way of fastening the mounting part 412 to the processor holder 30. In some embodiments, each of the mounting holes 412b of the mounting part 412 can be replaced with a thread hole, a protrusion or a latch.

The airflow guiding member 420a includes a pivoting part 421, a plate-shaped part 422 and a tab part 423 connected to one another. The pivoting part 421 is connected between the plate-shaped part 422 and the tab part 423. The pivoting part 421 is disposed on the through hole 412a of the mounting part 412 and abutted against a side edge of the protrusion part 411. A fastener 81 penetrates through the through hole 412a of the mounting part 412 to be fastened to the pivoting part 421, so that the pivoting part 421 is pivotable with respect to the mounting part 412. Thus, the airflow guiding member 420a is able to be pivoted to the base 410 via its pivoting part 421. The plate-shaped part 422 is disposed on the pivoting part 421, and extends away from the pivoting part 421. The plate-shaped part 422 is pivoted with the pivoting part 421. The tab part 423 protrudes from the pivoting part 421, and is located at an edge of the pivoting part 421 close to the mounting part 412 of the base 410. The aforementioned fastener 81 is, for example, a screw, but the present disclosure is not limited thereto.

In more detail, as shown in FIG. 5, the tab part 423 has a through hole 423a, the mounting part 412 has a plurality of fastening holes 412c. When the airflow guiding member 420a is pivoted with respect to the base 410, the through hole 423a of the tab part 423 is selectively aligned with one of the fastening holes 412c of the base 410. Then, a fastener 82 penetrates through the through hole 423a to be fastened into the aligned fastening hole 412c, so that the airflow guiding member 420a is fixed in one of air guiding positions with respect to the base 410. The aforementioned fastener 82 is, for example, a screw, but the present disclosure is not limited thereto. In addition, in this embodiment, the mounting part 412 has three fastening holes 412c, so that the airflow guiding member 420a is able to be pivoted with respect to the base 410 to shift among three different air guiding positions. However, the present disclosure is not limited to the number of the fastening holes 412c of the base 410 and the number of the air guiding positions. In some embodiments, the number of the fastening holes 412c can be two or over three, and the number of the air guiding positions is changed according to the number of fastening holes 412c.

In more detail, as shown in FIGS. 5 to 6, in this embodiment, the server 1 further includes two elastic members 60 and two gaskets 70. The mounting part 412 of the base 410 further has a plurality of positioning holes 412d.

The elastic member 60 is, for example, a compression spring, but the present disclosure is not limited thereto. In some embodiments, the elastic member 60 can be replaced with an object, such as rubber which is deformable under load but able to recover to their original condition when the load is removed.

The pivoting part 421 has a cavity 421s and two sliding grooves 421l. The cavity 421s is configured for accommodating one of the elastic members 60 and one of the gaskets 70. The two sliding grooves 421l are located at two sides of the cavity 421s opposite to each other.

The positioning holes 412d surround the through hole 412a. In this embodiment, the number of the positioning holes 412d is ten. The ten positioning holes 412d are divided into two groups, and the two groups are respectively located at two sides of the through hole 412a, but the present disclosure is not limited to the number of the positioning holes 412d. In addition, in this embodiment, each positioning hole 412d is a through hole, but the present disclosure is not limited thereto. In some embodiments, each positioning hole 412d can be an indentation but not penetrating through the mounting part 412.

The gasket 70 is a disc-shaped object, and is made of, for example, rubber, but the present disclosure is not limited thereto. The gasket 70 is directly located on the positioning holes 412d of the base 410. Each gasket 70 includes a main part 71, two ears 72 and a plurality of raised dots 73. The ears 72 are respectively located at two side edges of the main part 71 which are opposite to each other, and the ears 72 respectively correspond to the sliding grooves 421l of the pivoting part 421. The raised dots 73 are located at a side of the main part 71 facing the mounting part 412, and the raised dots 73 surround the center of the main part 71. The raised dots 73 are selectively fixed into some of the positioning holes 412d of the mounting part 412. In this embodiment, the number of the raised dots 73 is six, the six raised dots 73 are divided into two groups respectively located at two sides of the main part 71, but the present disclosure is not limited to the number of the raised dots 73.

In detail, the elastic member 60 and the gasket 70 are located in the cavity 421s of the pivoting part 421. The gasket 70 is located at an end of the elastic member 60 opposite to the pivoting part 421; that is, the elastic member 60 is located between and pressed by the pivoting part 421 and the gasket 70. In more detail, the two ears 72 of the gasket 70 are respectively slidable in two sliding grooves 421l of the pivoting part 421. The gasket 70 is constantly pushed away from the pivoting part 421 by the elastic member 60. Thus, when the airflow guiding member 420a is pivoted with respect to the base 410, the gasket 70 is pivoted with the pivoting part 421, so that the raised dots 73 are selectively fixed into some of the positioning holes 412d of the mounting part 412, for fixing the airflow guiding member 420a in one of the air guiding positions with an efficient manner and providing a fool-proofing effect.

However, the elastic member 60, the gasket 70 and the positioning holes 412d of the mounting part 412 are optional; the present disclosure is not limited thereto. In some embodiments, the elastic member 60 can be omitted, and the gasket 70 and the positioning holes 412d are remained; in such a casing, the gasket may be fixed in place, but the gasket is still able to be rotated with respect to the mounting part 412. In yet another embodiment, the elastic member 60, the gasket 70 and the positioning holes 412d may be all omitted. In addition, the tab part 423 and the fastening holes 412c of the mounting part 412 are optional; the present disclosure is not limited thereto. In some embodiments, the tab part 423 and the fastening holes 412c of the mounting part 412 may be omitted; in such a casing, the pivoting part 421 and the mounting part 412 are close-fit, so that the pivoting part 421 is able to be maintained at one of the air guiding positions while it is pivoted with respect to the mounting part 412.

The airflow guiding member 420b is not illustrated hereafter since its configuration and the structural relationship with the base 410 are similar to that of the airflow guiding member 420a. However, the airflow guiding member 420a and the airflow guiding member 420b can be different in shape and size according to the arrangement of the peripheral server components. That is, the present disclosure is not limited to the shape or the size of the plate-shaped part.

In addition, in the aforementioned embodiments, the air baffle 40 has two airflow guiding members, the airflow guiding member 420a and the airflow guiding member 420b, but the present disclosure is not limited to the number of the airflow guiding members. In some embodiments, the airflow guiding member 420b or the airflow guiding member 420a can be omitted. In such a casing, only one set of related components for the mounting of the airflow guiding member is remained. In yet another embodiment, the number of airflow guiding members can be three or over three, and these airflow guiding members are respectively located at different corners of the base.

In addition, in this or some embodiments, it is optional to mount a system air baffle (not shown) on the server 1, the system air baffle covers the electronic components such as the air baffle 40, the processor module and the processor holders 30 in order to guide the airflow generated by the air outlet side 20a and prevent the airflow from escaping to outside from the air outlet side 20a. However, the present disclosure is not limited to the system air baffle.

Then, the comparison between having the air baffle 40 and not having the air baffle 40 is illustrated in the following paragraphs. Please refer to FIG. 7, which is a schematic view showing the operation of the server in FIG. 1.

Figure 7:
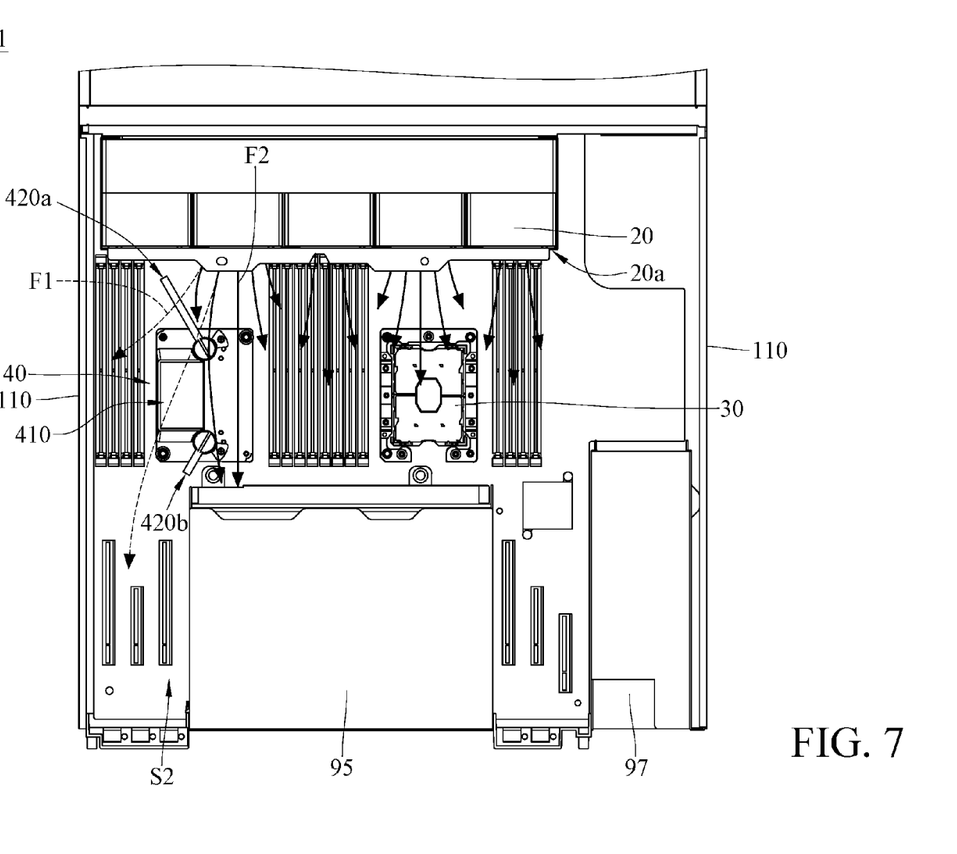
FIG. 7 is a schematic view showing the operation of the server in FIG. 1.

As shown in FIG. 7, the processor holder 30 is not disposed with the air baffle 40, and the processor holder is disposed with the air baffle 40. Firstly, please see the airflow F1 (shown in dashed line, and at the left side of the server 1), the airflow F1 is the airflow, which is generated by the fan module 20, flowing through the processor holder 30, which is not mounted with the processor module and the air baffle 40. The top of the processor holder 30, which is not mounted with the processor module and the air baffle 40, forms an open space thereabove, so the airflow F1 becomes more turbulent when flowing through the said open space. As a result, most of the airflow F1 in the said open space easily flows to the area for expansion S2 (i.e. the area having no requirement of being cooled down), for example, the area on the left side of the electronic component 95, so the airflow to the electronic component 95 is decreased, causing the electronic component 95 to overheat. The overheated electronic component 95 may affect the speed of its operation and shorten its lifespan, and further affect the operation of the server 1.

Then, please see the airflow F2 (shown in solid line, and at the left side of the server 1), the airflow F2 is the airflow, which is generated by the fan module 20, flowing through the processor holder, which is not mounted with the processor module but mounted with the air baffle 40. Because the airflow guiding members 420a and 420b are respectively pivotable with respect to the base 410 (i.e. each of the airflow guiding members 420a and 420b is able to be selectively shifted to a specific air guiding position), as seen from the point view of FIG. 7, the airflow F2 from the air outlet side 20a of the fan module 20 is guided by the inclined airflow guiding members 420a and 420b of the air baffle 40 in order to flow to the electronic component 95 at the rear side of the server 1. That is, the airflow guiding members 420a and the 420b are favorable for efficiently control the airflow from the fan module so as to prevent the problem of the electronic component 95 lacking the airflow. Accordingly, the electronic component 95 is prevented from overheating, so that the operation of the server 1 is maintained in a standard condition.

Figure 8:
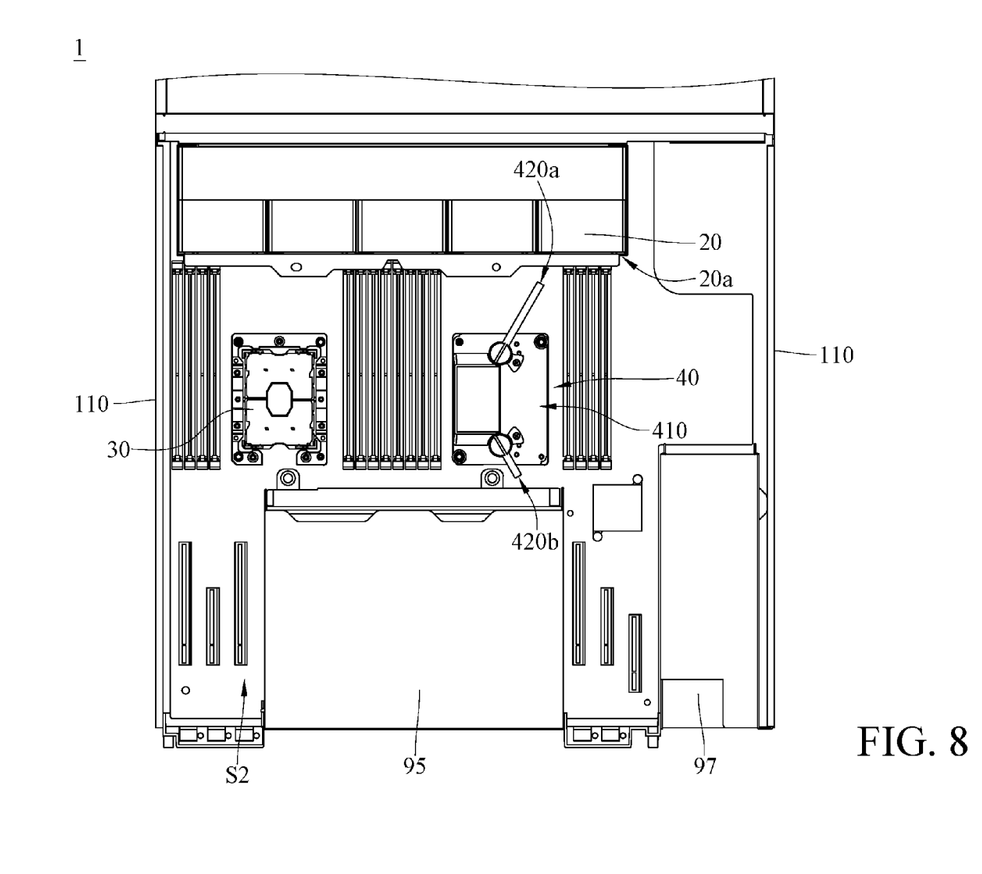
FIG. 8 is another schematic view showing the operation of the server according to one embodiment of the disclosure.

In addition, please refer to FIG. 8, which is another schematic view showing the operation of the server according to one embodiment of the disclosure. As shown in FIG. 8, in this embodiment, the air baffle 40 is disposed on the processor holder 30 located at the right side of the server 1. Similar to the aforementioned embodiments, the airflow guiding members 420a and 420b are pivotable with respect to the base 410 (i.e. each of the airflow guiding members 420a and 420b is selectively shifted to different air guiding positions), so that the airflow generated by the fan module 20 is able to be guided by the air baffle 40 in order to flow to the electronic component at the rear side of the server 1, thereby providing sufficient air to the electronic components inside the server 1.

According to the server as discussed above, the air baffle is disposed on one of the processor holder which is not mounted with any processor module, and the airflow guiding member of the air baffle is able to be selectively shifted to different air guiding positions with respect to the server in accordance with the location of the air baffle, so the air baffle is able to guide the airflow generated by the fan module to the target electronic components, thereby preventing the said airflow from flowing to undesired area and maintaining the amount of cooling air for the said target electronic components. Therefore, the performance of the server is improved, and the amount of energy required to operate the fan module can be reduced.

In addition, the airflow guiding member can be pivoted with respect to the base in order to efficiently control the airflow of the fan module.

What is claimed is:
1. A server, comprising:
a casing having an accommodating space;
a fan module being located in the accommodating space of the casing;
at least two processor holders being located in the accommodating space of the casing, and being located close to an air outlet side of the fan module; and
at least one air baffle comprising a base and at least one airflow guiding member connected to each other, the at least one airflow guiding member being detachably pivoted on the base, the at least one airflow guiding member being pivotable with respect to the base to be shiftable among a plurality of air guiding positions;
wherein, a processor module is mounted on one of the at least two processor holders, the base of the at least one air baffle is mounted on the other one of the at least two processor holders, the at least one airflow guiding member is at one of the plurality of air guiding positions in order to guide airflow from the air outlet side of the fan module.

2. The server according to claim 1, further comprising at least one fastener, wherein the at least one airflow guiding member comprises a pivoting part, a plate-shaped part and a tab part, the pivoting part is pivoted on the base, the plate-shaped part is disposed on the pivoting part, the tab part protrudes from the pivoting part, the tab part is located close to the base, the tab part has a through hole, the base has a plurality of fastening holes located close to the pivoting part, the through hole of the tab part is selectively aligned with one of the plurality of fastening holes of the base, the at least one fastener penetrates through the through hole to be fastened to one of the plurality of fastening holes aligned with the through hole in order to fix the at least one airflow guiding member at one of the plurality of air guiding positions with respect to the base.

3. The server according to claim 1, further comprising at least one gasket, wherein the at least one airflow guiding member comprises a pivoting part and a plate-shaped part, the pivoting part is pivoted on the base, the at least one gasket is disposed on a side of the pivoting part facing the base, the plate-shaped part is disposed on the pivoting part, the base has a plurality of positioning holes located close to the at least one gasket, the at least one gasket comprises a main part and a plurality of raised dots, the plurality of raised dots are located on a side of the main part facing the plurality of positioning holes, the plurality of raised dots are selectively fixed in some of the plurality of positioning holes in order to fix the at least one airflow guiding member at one of the plurality of air guiding positions with respect to the base.

4. The server according to claim 3, further comprising at least one fastener, the at least one airflow guiding member further comprises a tab part, the tab part protrudes from the pivoting part, and is located close to the base, the tab part has a through hole, the base has a plurality of fastening holes located close to the pivoting part, the through hole of the tab part is selectively aligned with one of the plurality of fastening holes of the base, the at least one fastener penetrates through the through hole to be fixed to one of the plurality of fastening holes aligned with the through hole.

5. The server according to claim 4, further comprising at least one elastic member being located between and pressed by the at least one gasket and the pivoting part.

6. The server according to claim 1, wherein the number of the at least one airflow guiding member is two, the two airflow guiding members are respectively detachably pivoted on two sides of the base which are opposite to each other.

7. The server according to claim 1, further comprising at least one electronic component, the at least one electronic component being located in the accommodating space of the case, located at a side of the at least two processor holders away from the fan module, and located close to the at least one air baffle, so that the airflow from the air outlet side of the fan module is guided toward the at least one electronic component by the airflow guiding member.

8. The server according to claim 1, wherein the base of the at least one air baffle has a plurality of mounting holes configured for the at least one air baffle to mount on one of the at least two processor holders.

9. The server according to claim 1, further comprising a system air baffle, the system air baffle being detachably located in the accommodating space of the casing, located close to the air outlet side of the fan module, and covering the at least two processor holders and the at least one air baffle in order to guide the airflow.

\* \* \* \* \*